United States Patent
Zhang

(10) Patent No.: US 12,205,863 B2
(45) Date of Patent: Jan. 21, 2025

(54) SELF-COOLING SEMICONDUCTOR RESISTOR AND MANUFACTURING METHOD THEREOF

(71) Applicant: MONTAGE TECHNOLOGY CO., LTD., Shanghai (CN)

(72) Inventor: Xiong Zhang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 398 days.

(21) Appl. No.: 17/836,182

(22) Filed: Jun. 9, 2022

(65) Prior Publication Data
US 2022/0399243 A1 Dec. 15, 2022

(30) Foreign Application Priority Data
Jun. 9, 2021 (CN) .......................... 202110644408.2

(51) Int. Cl.
| | |
|---|---|
| H01L 23/367 | (2006.01) |
| H01L 21/48 | (2006.01) |
| H01L 23/495 | (2006.01) |
| H01L 49/02 | (2006.01) |

(52) U.S. Cl.
CPC ........ H01L 23/367 (2013.01); H01L 21/4882 (2013.01); H01L 23/49568 (2013.01); H01L 28/20 (2013.01)

(58) Field of Classification Search
CPC ......... H10N 10/17; H10N 10/10; H01L 28/20
See application file for complete search history.

(56) References Cited

U.S. PATENT DOCUMENTS

| | | | | |
|---|---|---|---|---|
| 6,351,021 B1* | 2/2002 | Hemmenway | ...... | H01L 27/0635 257/E21.572 |
| 6,369,409 B1* | 4/2002 | Takasu | ..................... | H01L 21/84 257/E27.047 |
| 9,773,717 B1 | 9/2017 | Koswatta et al. | | |
| 2001/0049175 A1* | 12/2001 | Huang | ................ | H01L 27/0682 257/E27.025 |
| 2005/0181589 A1* | 8/2005 | Miyawaki | ............... | H01L 28/20 438/587 |
| 2005/0285147 A1* | 12/2005 | Usui | ...................... | H05K 1/185 257/E27.115 |

* cited by examiner

Primary Examiner — Evren Seven
(74) Attorney, Agent, or Firm — Oliff PLC

(57) ABSTRACT

Self-cooling semiconductor resistor and manufacturing method thereof are provided. The resistor comprises: multiple N-type and P-type wells in a semiconductor substrate, first polysilicon gates on each N-type well, second polysilicon gates on each P-type well, and metal interconnect layers. The multiple N-type and P-type wells are arranged alternately in row and column direction, respectively. N-type and P-type deep doped regions are formed on each N-type and P-type well, respectively. The first and second polysilicon gates are N-type and P-type deep doped respectively, and there is no gate oxide layer between the first and second polysilicon gates and the semiconductor substrate. The metal interconnect layers connect the multiple first and second polysilicon gates as an S-shaped structure. In the present application, the flow direction of heat is from the inside of the resistor to its surface, thereby realizing heat dissipation and cooling.

10 Claims, 5 Drawing Sheets

SELF-COOLING SEMICONDUCTOR RESISTOR AND MANUFACTURING METHOD THEREOF

TECHNICAL FIELD

The disclosure generally relates to the technical field of semiconductor, in particular to a self-cooling semiconductor resistor and a manufacturing method thereof.

BACKGROUND TECHNOLOGY

Chips are called as "food" of modern industry, and are important basic components of information technology industry. The development of mobile phones, computer vehicles, industrial control, Internet of Things, big data, artificial intelligence and other fields is inseparable from chips. In addition to working according to designed functions, the chips will inevitably generate heat. It is important to ensure the safety and reliability of products to dissipate the heat efficiently to keep internal devices of the chips working at a safe temperature. With the increase of chip scale and speed, it is becoming more and more challenging, and innovative ideas and methods need to be introduced.

Peltier effect refers to a phenomenon of heat absorption and heat release at joints of different conductors when current flows through a loop composed of different conductors. Existing designs based on metal Peltier effect, usually have a weak cooling effect and are incompatible with existing semiconductor CMOS processes, which also requires an additional cooling mode and brings inconvenience to the application. Therefore, there is a need to provide a self-cooling Peltier resistor to achieve better process compatibility and cooling effect.

SUMMARY OF THE INVENTION

An object of the present disclosure is to provide a self-cooling semiconductor resistor and a manufacturing method thereof, which provides a peltier device compatible with the existing CMOS processes, and can be applied to various types of chips and improve the overall performance of the chips.

In one aspect of the present application, a self-cooling semiconductor resistor is provided, the resistor comprises:
  multiple N-type wells and multiple P-type wells in a semiconductor substrate, the multiple N-type wells and the multiple P-type wells are arranged alternately in row direction and in column direction, respectively, and each N-type well has an N-type deep doped region formed therein and each P-type well has a P-type deep doped region formed therein;
  first polysilicon gates on each of the N-type wells, the first polysilicon gates are N-type deep doped and there is no gate oxide layer between the first polysilicon gates and the semiconductor substrate;
  second polysilicon gates on each of the P-type wells, the second polysilicon gates are P-type deep doped and there is no gate oxide layer between the second polysilicon gates and the semiconductor substrate; and
  metal interconnect layers connected the first polysilicon gates and the second polysilicon gates as an S-shaped structure.

In some embodiments, the resistor further comprises: shallow trench isolation regions surrounding the multiple N-type wells and the multiple P-type wells.

In some embodiments, the resistor further comprises: sidewalls formed around the first polysilicon gates and the second polysilicon gates.

In some embodiments, the resistor further comprises: silicide formed on the first polysilicon gates and the second polysilicon gates.

In some embodiments, when the self-cooling semiconductor resistor is in operation, current sequentially flows through the first polysilicon gate, the N-type deep doped region, the P-type deep doped region and the second polysilicon gate, and then sequentially circulates, and heat flows from the N-type deep doped region to the first polysilicon gate, and then flows from the P-type deep doped region to the second polysilicon gate.

In another aspect of the present application, a method for manufacturing a self-cooling semiconductor resistor is provided, the method comprises:
  forming multiple N-type wells and multiple P-type wells in a semiconductor substrate, and the multiple N-type wells and the multiple P-type wells are arranged alternately in row direction and in column direction, respectively;
  forming polysilicon gates on each of the N-type wells and each of the P-type wells, there is no gate oxide layer between the polysilicon gates and the semiconductor substrate;
  forming N-type deep doped regions on each of the N-type wells, and the polysilicon gates on each of the N-type wells are doped as N-type deep doped first polysilicon gates;
  forming P-type deep doped regions on each of the P-type wells, and the polysilicon gates on each of the P-type wells are doped as P-type deep doped second polysilicon gates; and
  forming metal interconnect layers connected the first polysilicon gates and the second polysilicon gates as an S-shaped structure.

In some embodiments, before the step of forming polysilicon gates on each of the N-type wells and each of the P-type wells, the method further comprises:
  forming a gate oxide layer on the semiconductor substrate;
  removing the gate oxide layer on a portion of the semiconductor substrate; and
  depositing polysilicon, the polysilicon on the portion of the semiconductor substrate forms polysilicon gates.

In some embodiments, before the step of forming polysilicon gates on each of the N-type wells and each of the P-type wells, the method further comprises: forming a shallow trench isolation region surrounding the multiple N-type wells and the multiple P-type wells.

In some embodiments, before the step of forming the metal interconnect layers, the method further comprises: forming sidewalls around the first polysilicon gates and the second polysilicon gates.

In some embodiments, before the step of forming the metal interconnect layers, the method further comprises: forming silicide on the first polysilicon gates and the second polysilicon gates.

DETAILED IMPLEMENTATION

In the following description, numerous technical details are set forth in order to provide readers with a better understanding of the present application. However, those skilled in the art can understand that the technical solutions claimed in the present application can be implemented without these technical details and various changes and modifications based on the following embodiments.

In the following, several different embodiments are given according to different features of the present application. The specific elements and arrangements of the present application are for simplicity, but the present application is not limited to these embodiments. For example, the description of forming a first element on a second element may include embodiments in which the first element is in direct contact with the second element, as well as embodiments in which additional elements are formed between the first element and the second element such that the first element and the second element are indirectly contact. In addition, for the sake of simplicity, the present application is represented by repeated element symbols and/or letters in different examples, but does not mean that there is a specific relationship between the embodiment s and/or structures. It is important to understand that when a layer is "on" another layer or substrate, it may mean that it is directly on the other layer or substrate, or that other layer is sandwiched between other layers or substrates.

Figure 1:
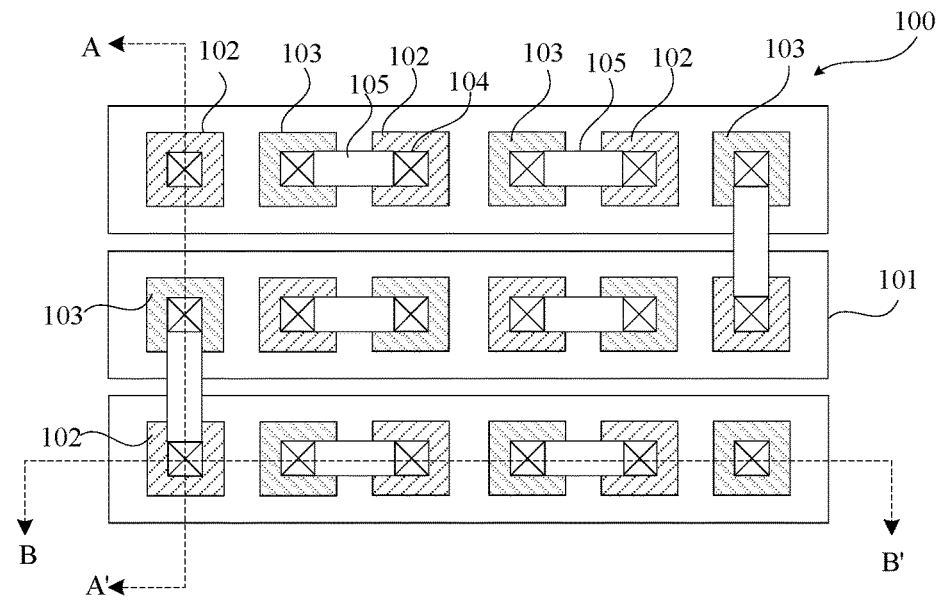
FIG. 1 shows a top view of a self-cooling semiconductor resistor in an embodiment of the present application.
Figure 2:
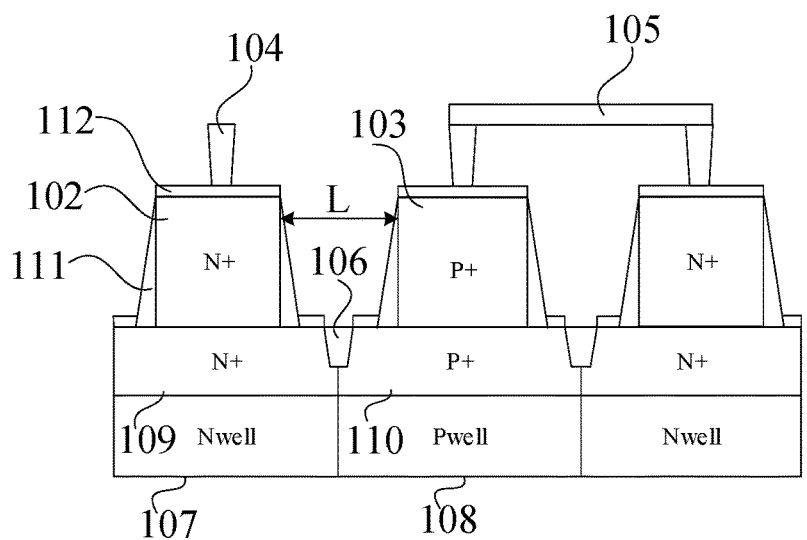
FIG. 2 shows a cross-sectional view of the self-cooling semiconductor resistor in FIG. 1 along the AA' direction in an embodiment of the present application.
Figure 3:
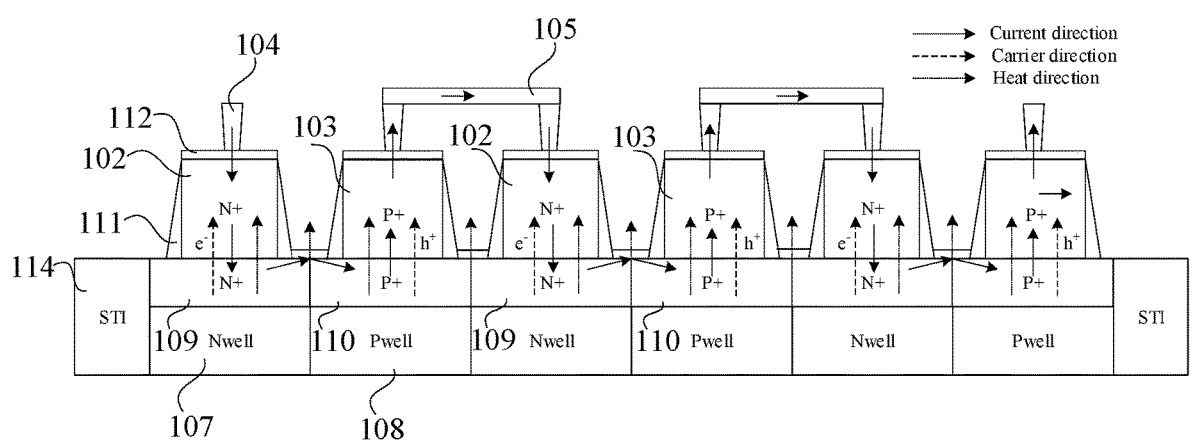
FIG. 3 shows a cross-sectional view of the self-cooling semiconductor resistor in FIG. 1 along the BB' direction in an embodiment of the present application.
Figure 5A:
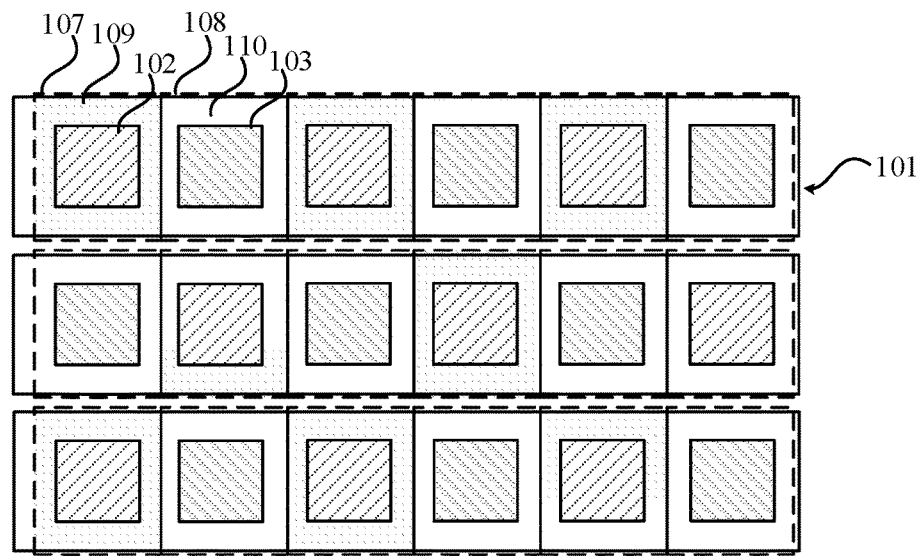
FIG. 5(a) shows a top view of N/P type wells and N+/P+ deep doped regions of a self-cooling semiconductor resistor in an embodiment of the present application.
Figure 5B:
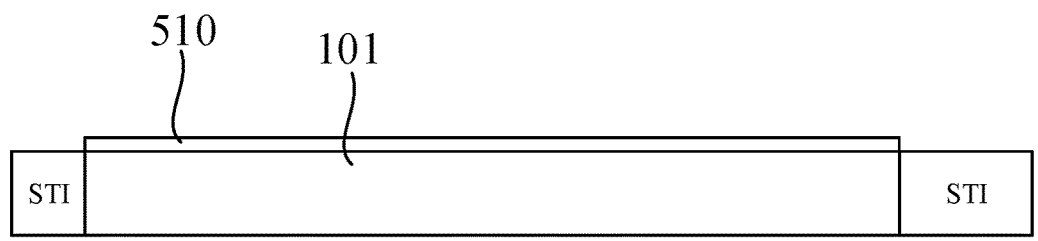
FIG. 5(b) shows a schematic diagram of forming a gate oxide layer on a semiconductor substrate in a method for manufacturing the self-cooling semiconductor resistor in an embodiment of the present application.

The present application discloses a self-cooling semiconductor resistor. FIG. 1 shows a top view of a self-cooling semiconductor resistor 100 in one embodiment. FIG. 2 shows a cross-sectional view of the self-cooling semiconductor resistor 100 in FIG. 1 along AA' direction. FIG. 3 shows a cross-sectional view of the self-cooling semiconductor resistor 100 in FIG. 1 along BB' direction. In conjunction with FIGS. 1 to 3, the resistor 100 comprises multiple N-type wells 107 and multiple P-type wells 108 located in a semiconductor substrate 101, first polysilicon gates 102 located on each of the N-type wells 107, second polysilicon gates 103 located on each of the P-type wells 108, vias 104, and metal interconnect layers 105. Refer to FIG. 5(a), the multiple N-type wells 107 and the multiple P-type wells 108 are arranged alternately in row direction and in column direction, respectively. Each N-type well 107 has an N-type deep doped region 109 formed therein. Each P-type well 108 has a P-type deep doped region 110 formed therein.

In one embodiment, the first polysilicon gates 102 are N-type deep doped and there is no gate oxide layer between the first polysilicon gates 102 and the semiconductor substrate 101. The second polysilicon gates 103 are P-type deep doped and there is no gate oxide layer between the second polysilicon gates 103 and the semiconductor substrate 101. The metal interconnect layers 105 connect the multiple first polysilicon gates 102 and the multiple second polysilicon gates 103 as an S-shaped structure.

In one embodiment, referring to FIG. 2, the resistor 100 further includes a shallow trench isolations 106 each located between the N-type deep doped region 109 and the P-type deep doped region 110.

In one embodiment, referring to FIG. 2 and FIG. 3, the resistor 100 further includes sidewalls 111 formed around the first polysilicon gates 102 and the second polysilicon gates 103.

In one embodiment, referring to FIG. 2 and FIG. 3, the resistor 100 further includes silicide 112 formed on the first polysilicon gates 102 and the second polysilicon gates 103.

In one embodiment, referring to FIG. 3, the resistor 100 further includes shallow trench isolations 114 surrounding the multiple N-type wells 102 and the multiple P-type wells 103.

Refer to FIG. 3, when the self-cooling semiconductor resistor in this embodiment is in operation, the via 104 is connected to a power supply voltage, and current sequentially flows through the first polysilicon gate 102, the N-type deep doped region 109, the P-type deep doped region 110 and the second polysilicon gate 103, and then flows to the next first polysilicon gate 102 and sequentially circulates. The first polysilicon gate 102 and the N-type deep doped region 109 are both N-type doped, the carriers are electrons $e^-$, and the flow direction of the carriers $e^-$ is from the N-type deep doped region 109 to the first polysilicon gate 102. Then, the current flows from the N-type deep doped region 109 to the P-type deep doped region 110, and then from the P-type deep doped region 110 to the second polysilicon gate 103. The P-type deep doped region 110 and the second polysilicon gate 103 are both P-type doped, the carriers are holes $h^+$, and the flow direction of the carriers $h^+$ is from the P-type deep doped region 110 to the second polysilicon gate 103. Inside the resistor 100, the flow direction of the heat is the direction of the carriers. Therefore, the flow direction of the heat is from the N-type deep doped region 109 to the first polysilicon gate 102, and then from the P-type deep doped region 110 to the second polysilicon gate 103, that is, from the inside of the resistor to its surface, thereby achieving heat dissipation and cooling.

In practical applications, the cooling effect that can be achieved by the present application depends on the magnitude of the working current flowing through the resistor, and the current may be from a few microamperes to hundreds of milliamperes. Compared with traditional resistors, the present application can reduce the working temperature of the resistor and the chip without increasing additional power consumption, improve the reliability of the chip, and increase the safe working range of the chip.

Figure 4:
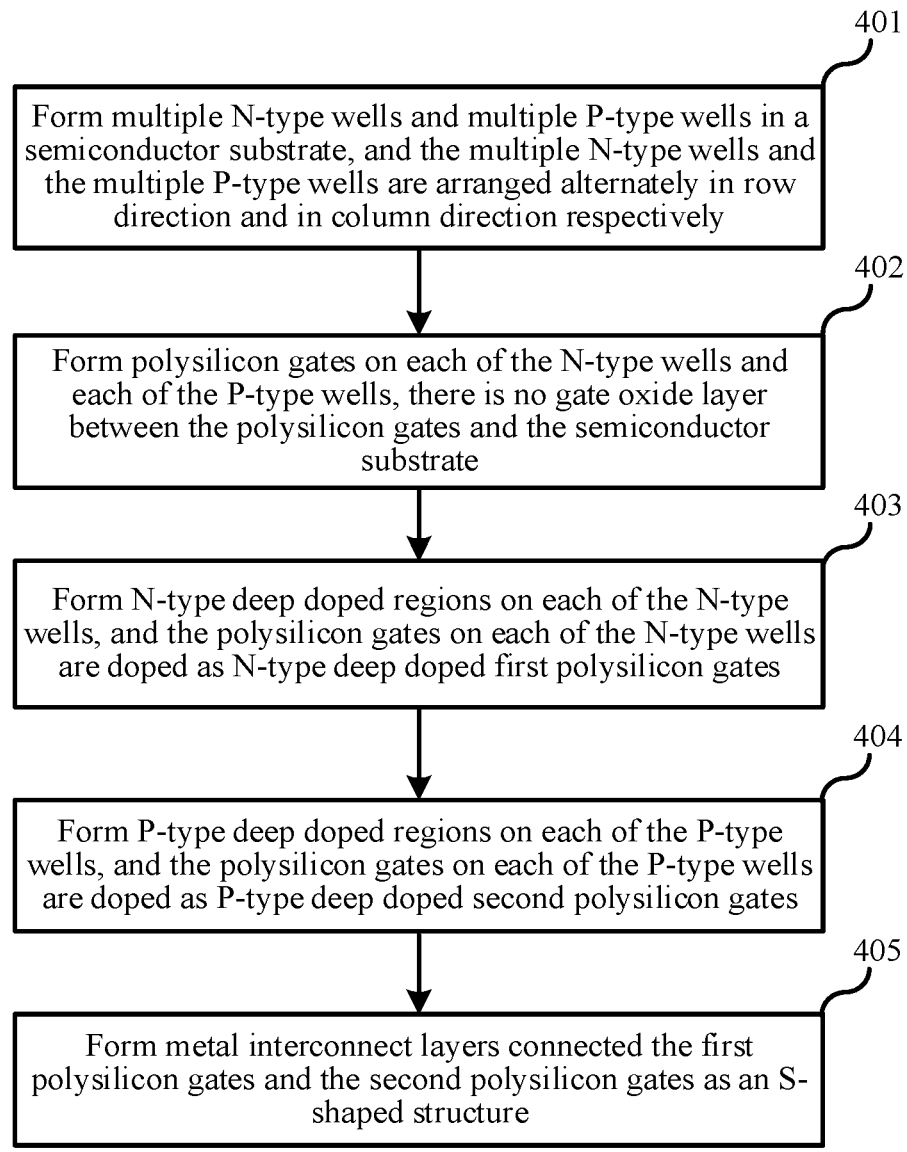
FIG. 4 is a flowchart of a method for manufacturing a self-cooling semiconductor resistor in an embodiment of the present application.

Another embodiment of the present application also discloses a method for manufacturing the self-cooling semiconductor resistor. FIG. 4 shows a flow chart of the method for manufacturing the self-cooling semiconductor resistor, and the manufacturing method in this embodiment is described in detail in conjunction with FIGS. 5(a) to 5(f). The method includes the following steps:

In step 401, as shown in FIG. 5(a), a semiconductor substrate 101 is provided, in which multiple N-type wells 107 and multiple P-type wells 109 are formed. The multiple N-type wells 107 and the multiple P-type wells 109 are arranged alternately in row direction and in column direction, respectively.

Figure 5C:
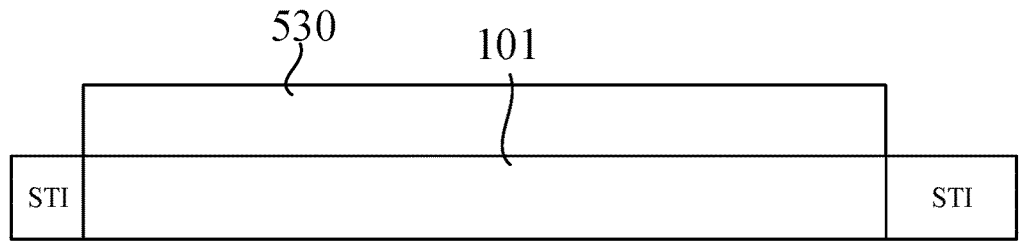
FIG. 5(c) shows a schematic diagram of forming polysilicon on a semiconductor substrate in a method for manufacturing the self-cooling semiconductor resistor in an embodiment of the present application.
Figure 5D:
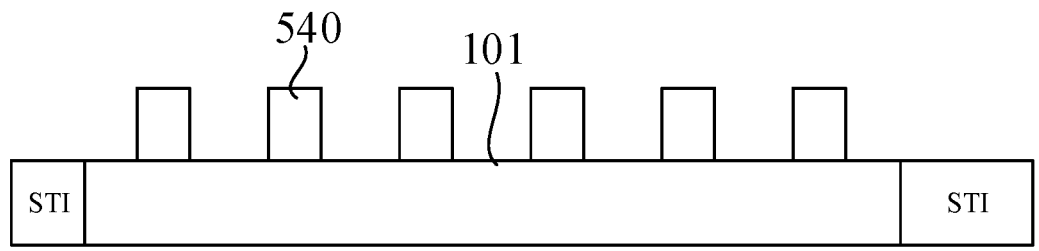
FIG. 5(d) is a schematic diagram of forming polysilicon gates on a semiconductor substrate in a method for manufacturing the self-cooling semiconductor resistor in an embodiment of the present application.

In step 402, polysilicon gates are formed on each of the N-type wells and each of the P-type wells, and there is no gate oxide layer between the polysilicon gates and the semiconductor substrate. Specifically, referring to FIG. 5(b), a gate oxide layer 510 is formed on the semiconductor substrate 101, a patterned photoresist (not shown) is formed on the gate oxide layer 510. Then, the gate oxide layer 510 is etched and the gate oxide layer 510 on a portion of the semiconductor substrate 101 is removed. Refer to FIG. 5(c), polysilicon 530 is deposited on the portion of the semiconductor substrate 101. Refer to FIG. 5(d), the polysilicon 530 is etched to form polysilicon gates 540. It should be understood that in this embodiment, the polysilicon deposited on the unetched gate oxide layer 510 is used to form the gates of the transistors (not shown), and the polysilicon deposited on the etched gate oxide layer 510 is used to form the polysilicon gates 540 of the resistor 100.

Figure 5E:
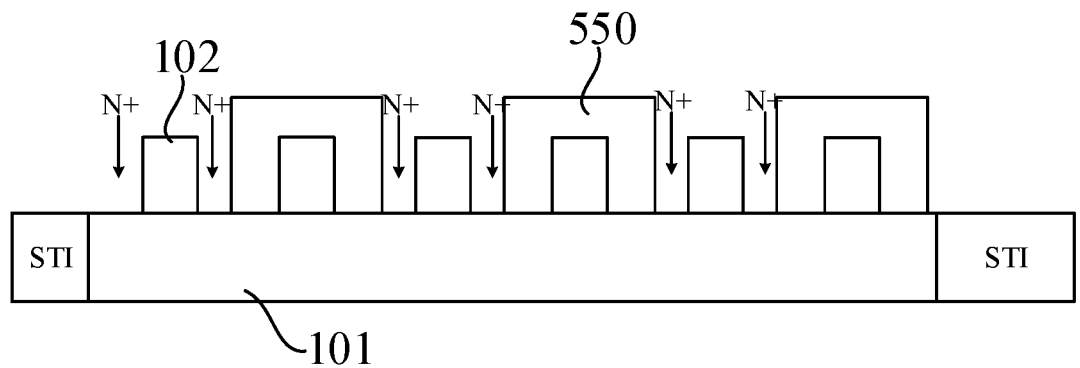
FIG. 5(e) is a schematic diagram of performing N-type ion implantation in a method for manufacturing the self-cooling semiconductor resistor in an embodiment of the present application.

In step 403, referring to FIG. 5(e), a patterned photoresist 550 is deposited on the portion of the semiconductor substrate 101, which covers the P-type wells 108 and exposes the N-type wells 107. Then N-type ion implantation is performed to form N-type deep doped regions 109 on each of the N-type wells 107. At the same time, the polysilicon gates on each of the N-type wells 107 are doped as N-type deep doped first polysilicon gates 102. Then, the patterned photoresist 550 is removed.

Figure 5F:
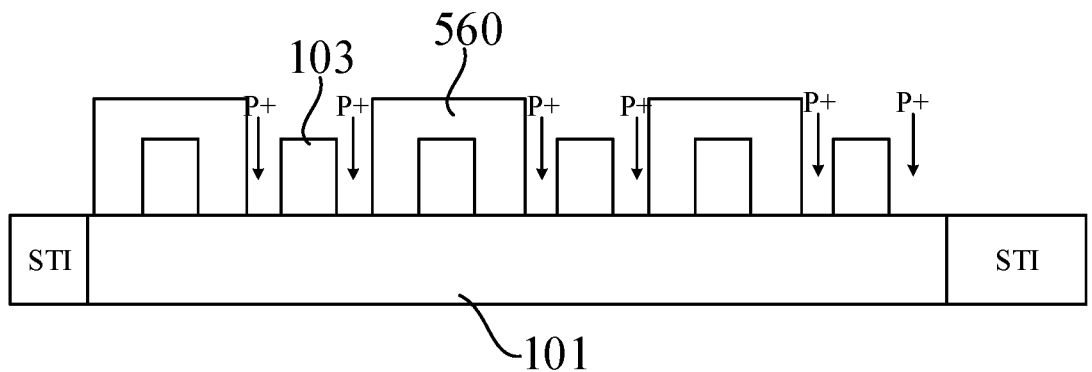
FIG. 5(f) is a schematic diagram of performing P-type ion implantation in a method for manufacturing the self-cooling semiconductor resistor in an embodiment of the present application.

In step 404, referring to FIG. 5(f), a patterned photoresist 560 is deposited on the portion of the semiconductor substrate 101, which covers the N-type wells 108 and exposes the P-type wells 107. Then P-type ion implantation is performed to form P-type deep doped regions 110 on each of the P-type wells 108. At the same time, the polysilicon gates on each of the P-type wells 108 are doped as P-type deep doped second polysilicon gates 103. Then, the patterned photoresist 560 is removed. After the step 404, the structure shown in FIG. 5(a) is formed.

In step 405, referring to FIG. 2 and FIG. 3, vias 104 are formed on each of the first polysilicon gates 102 and each of the second polysilicon gates 103, and then metal interconnect layers 105 are formed. The metal interconnect layers 105 connect the first polysilicon gates 102 and the second polysilicon gates 103 as an S-shaped structure, the structure of which is shown in FIG. 1.

In one embodiment, before the step of forming multiple N-type wells 107 and multiple P-type wells 109 in the semiconductor substrate, the method further comprises: forming shallow trench isolation regions 114 surrounding the multiple N-type wells and the multiple P-type wells, the structure of which is shown in FIG. 3.

In one embodiment, before the step of forming the metal interconnect layers 105, the method further comprises: forming sidewalls 111 around the first polysilicon gates 102 and the second polysilicon gates 103, the structure of which is shown in FIG. 3.

In one embodiment, before the step of forming the metal interconnect layers 105, the method further comprises: forming silicide 112 on the first polysilicon gates 102 and the second polysilicon gates 103, the structure of which is shown in FIG. 3.

The first embodiment is a product embodiment corresponding to the present embodiment, and the technical details in the first embodiment can be applied to the present embodiment, and the technical details in the present embodiment can also be applied to the first embodiment.

In the implementation of the present application, the heat flow flows from the inside of the resistor to its surface, so as to realize heat dissipation and cooling. Because the Seebeck coefficient of N+/P+ of semiconductor materials is relatively large, which is about 30 times larger than that of metal materials, only 1/30 of the current is needed to achieve the same effect as metal-based peltier devices.

Compared with the existing CMOS process, the present application only needs to add one photolithography and etching process to remove the gate oxide layer between the polysilicon gates and the semiconductor substrate. Furthermore, in the polysilicon patterning process and the P-type and N-type ion implantation processes, only the pattern design in the layout needs to be modified, and no additional photolithography process needs to be added. The implementation of the present application is fully compatible with the existing CMOS process, does not introduce special materials and processes, and has full feasibility.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results.

What is claimed is:

1. A self-cooling semiconductor resistor, comprising:
   multiple N-type wells and multiple P-type wells in a semiconductor substrate, the multiple N-type wells and the multiple P-type wells being arranged alternately in a row direction and in a column direction, respectively, wherein each N-type well has an N-type deep doped region formed therein and each P-type well has a P-type deep doped region formed therein;
   N-type deep doped polysilicon gates on each of the N-type wells, wherein there is no gate oxide layer between the N-type deep doped polysilicon gates and the semiconductor substrate;
   P-type deep doped polysilicon gates on each of the P-type wells, wherein there is no gate oxide layer between the P-type deep doped polysilicon gates and the semiconductor substrate; and
   metal interconnect layers connecting the N-type deep doped polysilicon gates and the P-type deep doped polysilicon gates as an S-shaped structure.

2. The self-cooling semiconductor resistor of claim 1, further comprising:
   shallow trench isolation regions surrounding the multiple N-type wells and the multiple P-type wells.

3. The self-cooling semiconductor resistor of claim 1, further comprising:
   sidewalls formed around the N-type deep doped polysilicon gates and the P-type deep doped polysilicon gates.

4. The self-cooling semiconductor resistor of claim 1, further comprising:
   silicide formed on the N-type deep doped polysilicon gates and the P-type deep doped polysilicon gates.

5. The self-cooling semiconductor resistor of claim 1,
   wherein when the self-cooling semiconductor resistor is in operation, current sequentially flows through the N-type deep doped polysilicon gate, the N-type deep doped region, the P-type deep doped region and the P-type deep doped polysilicon gate, and then sequentially circulates, and
   heat flows from the N-type deep doped region to the N-type deep doped polysilicon gate, and then flows from the P-type deep doped region to the P-type deep doped polysilicon gate.

6. A method for manufacturing the self-cooling semiconductor resistor of claim 1, the method comprising:
   forming the multiple N-type wells and the multiple P-type wells in the semiconductor substrate;
   forming polysilicon gates on each of the N-type wells and each of the P-type wells, there being no gate oxide layer between the polysilicon gates and the semiconductor substrate;
   forming the N-type deep doped regions on each of the N-type wells, and doping the polysilicon gates on each of the N-type wells to form the N-type deep doped polysilicon gates;
   forming the P-type deep doped regions on each of the P-type wells, and doping the polysilicon gates on each of the P-type wells to form the P-type deep doped polysilicon gates; and
   forming the metal interconnect layers connecting the N-type deep doped polysilicon gates and the P-type deep doped polysilicon gates as an S-shaped structure.

7. The method for manufacturing the self-cooling semiconductor resistor of claim 6, wherein before forming polysilicon gates on each of the N-type wells and each of the P-type wells, the method further comprises:
   forming a gate oxide layer on the semiconductor substrate;
   removing the gate oxide layer on a portion of the semiconductor substrate; and
   depositing polysilicon on the portion of the semiconductor substrate, wherein the polysilicon later forms the polysilicon gates.

8. The method for manufacturing the self-cooling semiconductor resistor of claim 6, wherein before forming polysilicon gates on each of the N-type wells and each of the P-type wells, the method further comprises:
   forming shallow trench isolation regions surrounding the multiple N-type wells and the multiple P-type wells.

9. The method for manufacturing the self-cooling semiconductor resistor of claim 6, wherein before forming the metal interconnect layers, the method further comprises:
   forming sidewalls around the N-type deep doped polysilicon gates and the P-type deep doped polysilicon gates.

10. The method for manufacturing the self-cooling semiconductor resistor of claim 6, wherein before the step of forming the metal interconnect layers, the method further comprises:
    forming silicides on the N-type deep doped polysilicon gates and the P-type deep doped polysilicon gates.

* * * * *